(12) United States Patent  (10) Patent No.: US 8,686,442 B2
Terano et al.  (45) Date of Patent: Apr. 1, 2014

(54) NITRIDE SEMICONDUCTOR LIGHT EMITTING DEVICE AND METHOD OF MANUFACTURING THE SAME

(75) Inventors: Akihisa Terano, Hachioji (JP); Aki Takei, Sayama (JP)

(73) Assignee: Oclaro Japan, Inc., Yokohama-shi (JP)

( * ) Notice: Subject to any disclaimer, the term of this patent is extended or adjusted under 35 U.S.C. 154(b) by 135 days.

(21) Appl. No.: 13/478,024

(22) Filed: May 22, 2012

(65) Prior Publication Data

US 2012/0228664 A1   Sep. 13, 2012

Related U.S. Application Data

(63) Continuation of application No. 12/193,992, filed on Aug. 19, 2008, now abandoned.

(30) Foreign Application Priority Data

Feb. 18, 2008 (JP) .................................. 2008-035868

(51) Int. Cl.
*H01L 27/15* (2006.01)
*H01L 29/26* (2006.01)

(52) U.S. Cl.
USPC .......................................................... 257/79

(58) Field of Classification Search
USPC .......................................................... 257/79
See application file for complete search history.

(56) References Cited

U.S. PATENT DOCUMENTS

| | | |
|---|---|---|
| 5,563,422 A | 10/1996 | Nakamura et al. |
| 6,459,100 B1 | 10/2002 | Doverspike et al. |
| 7,015,053 B2 | 3/2006 | Kozaki et al. |
| 2002/0031153 A1 | 3/2002 | Niwa et al. |
| 2002/0179005 A1 | 12/2002 | Koike et al. |
| 2006/0124956 A1 | 6/2006 | Peng |
| 2007/0034883 A1 | 2/2007 | Ohba |
| 2007/0141823 A1 | 6/2007 | Preble et al. |

FOREIGN PATENT DOCUMENTS

| | | |
|---|---|---|
| JP | 07-045867 A | 2/1995 |
| JP | 2004-221493 A | 8/2004 |
| JP | 2006-059933 A | 3/2006 |

*Primary Examiner* — Thao Le
*Assistant Examiner* — Geoffrey Ida
(74) *Attorney, Agent, or Firm* — Miles & Stockbridge P.C.

(57) ABSTRACT

The present invention provides a nitride semiconductor light emitting device having an n-electrode that has an Au face excellent in ohmic contacts to an n-type nitride semiconductor and excellent in mounting properties, and a method of manufacturing the same. The nitride semiconductor light emitting device uses an n-electrode having a three-layer laminate structure that is composed of a first layer containing aluminum nitride and having a thickness not less than 1 nm or less than 5 nm, a second layer containing one or more metals selected from Ti, Zr, Hf, Mo, and Pt, and a third layer made of Au, from the near side of the n-type nitride semiconductor in order of mention. The n-electrode thus formed is then annealed to obtain ohmic contacts to the n-type nitride semiconductor.

10 Claims, 6 Drawing Sheets

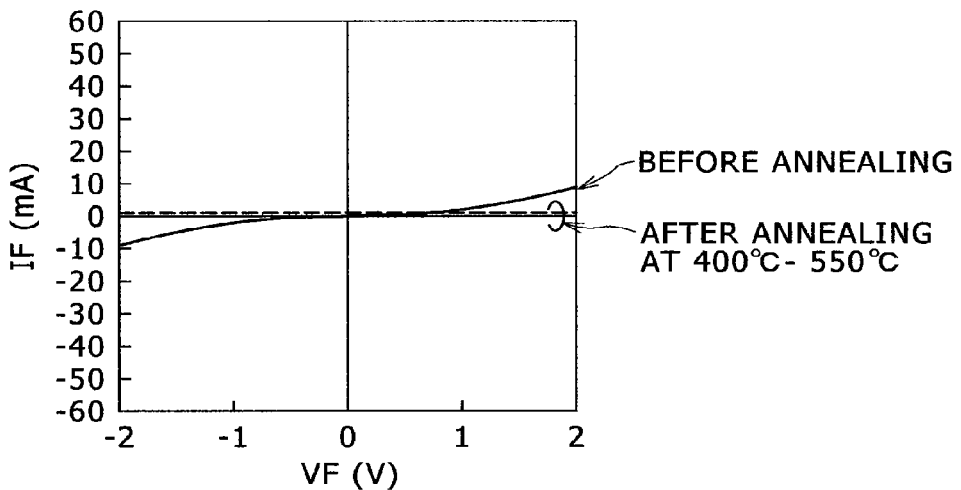
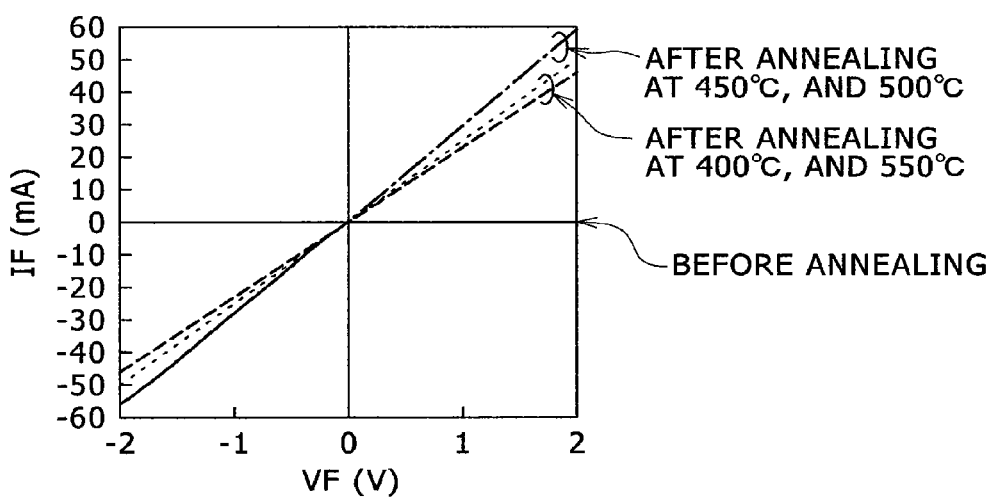

UNEVEN AREA

NITRIDE SEMICONDUCTOR LIGHT EMITTING DEVICE AND METHOD OF MANUFACTURING THE SAME

CROSS-REFERENCE TO RELATED APPLICATIONS

This application is a continuation of application Ser. No. 12/193,992 filed Aug. 19, 2008 now abandoned. The present application also claims priority from Japanese Patent Application No. JP2008-035868 filed on Feb. 18, 2008, the content of which is hereby incorporated by reference into this application.

BACKGROUND OF THE INVENTION

1. Field of the Invention

The present invention relates to a nitride semiconductor light emitting device such as light emitting diode (LED), laser diode (LD) or the like that operates in the visible to ultraviolet wavelength region, and a method of manufacturing the same.

2. Description of the Related Arts

Nitride semiconductors represented by gallium nitride (GaN) have been used as a material for light emitting elements capable of generating a light in the edge to ultraviolet region. In general, a light emitting element using a nitride semiconductor is provided with a light emitting layer (typically known as an active layer) having a multiple quantum well structure, and p-type and n-type nitride semiconductor layers for current feeding that are disposed above and below the light emitting layer.

With recent advances in the development of GaN substrate, laser diodes now demonstrate high performance of laser, high quality and high yield, which have been made possible by epitaxially growing a n-type nitride semiconductor layer, a light emitting layer, and a p-type nitride semiconductor layer sequentially on a n-type conductive GaN substrate such that dislocation density or defects within an epilayer can be reduced compared with epitaxial growth on a conventional sapphire substrate and the cleaved end-face of a flat resonator can easily be formed.

Moreover, the introduction of an n-type GaN substrate has shorten the manufacturing process of laser diodes by bringing a change in the structure of them, i.e., forming an n-type ohmic electrode on the rear side of the n-type GaN substrate, not on the exposed surface of an n-type nitride semiconductor layer provided to the core of an epitaxial growth layer by the conventional semiconductor process.

As an example, Japanese Patent Application Publication No. 07-45867 disclosed the primary use of Ti/Al electrode as an ohmic electrode at the bottom of an n-type nitride semiconductor, and explained that desirable ohmic contact with an n-type layer could be obtained by annealing the adhered electrode at high temperature.

However, when an electrode having Al on the uppermost surface undergoes annealing at high temperature, Al is oxidized. Thus, in the mount process for a device, if the electrode having Al on the outermost surface was used, bonding by Au wire or Au-based (e.g., Au—Sn alloy) soldering was not so strong but easily separated. As a result, sufficient junction strength between both sides was hard to obtain.

To resolve the above problem, Japanese Patent Application Publication No. 2006-59933 disclosed an ohmic electrode to be formed on the surface of an n-type nitride semiconductor, the ohmic electrode being provided with, from the near side the n-type nitride semiconductor, a first layer with thickness of 10 to 70 nm consisting of Al and/or an Al alloy, a second layer with thickness of 10 to 300 nm consisting of one or more metals selected from Pd, Ti, Nb, Mo and W for example, which have higher melting point than that of the first layer (Al, Al alloy) and the third layer (Au), and a third layer with thickness of 100 to 1000 nm consisting of Au, in sequential order. The ohmic electrode was then subjected to annealing at 350 to 600° C. to obtain desirable ohmic property against the n-type nitride semiconductor as well as a smooth and lustrous surface and desirable wire bonding property.

In particular, according to Patent Document 2, it is important that Pd with thickness of 50 nm is used as metal for the second layer, the ohmic property is checked on using, as a parameter, the thickness of a metal film containing Al of the first layer as a main ingredient, and the first layer film thickness is limited to a range of 10 nm to 70 nm so as to reduce contact resistance.

Further, it described that the relationship between the film thickness of the first layer metal and the contact resistance remained the same when the second layer was made of Pd metal and when the second layer was made of one of Ti, Nb, Mo and W, instead of Pd.

As yet another example, Japanese Patent Application, Publication No. 2004-221493 disclosed an electrode to be laminated on the surface of an n-type nitride semiconductor layer, the electrode being provided with, from the bottom, an Ti layer (e.g., 30 nm), an Al layer (e.g., 150 nm), a Mo layer (e.g., 30 nm), a Pt layer (e.g., 15 nm), and a Au layer (e.g., 200 nm) in sequential order, such that delamination of the Au layer is suppressed and diffusion of the Au layer into the semiconductor layer side can be nearly completely suppressed.

SUMMARY OF THE INVENTION

Based on the kinds of metals used for the diffusion barrier layer described in Japanese Patent Application Publication Nos. 2006-59933 and 2004-221493, the inventors formed an electrode having a five-layer laminate structure on an n-type nitride semiconductor layer, which is provided with an Al layer as the first layer with thickness of 100 nm, a diffusion barrier layer having a three-layer structure composed of a Mo layer with thickness of 50 nm, a Ti layer with thickness of 100 nm and a Pt layer with thickness of 50 nm, and lastly a Au layer with thickness of 300 nm in sequential order. The electrode then went though an annealing process at 500° C. under nitrogen atmosphere. It turned out that, as shown in FIG. 7, the electrode surface had a severely rugged or uneven area accompanied by discoloration.

The surface area was analyzed with the application of Auger electron spectroscopy, the analysis result of which is shown in FIG. 2.

From the drawing of the uneven surface area, the inventors identified Al, which was supposed to be at the undermost layer of the electrode, on the uppermost layer of the electrode instead and observed the presence of oxygen in addition to Al there, which implies that oxidized Al was formed on the uppermost layer of the electrode.

On the contrary, Au having been at the uppermost layer seemed to be diffused towards the semiconductor.

In effect, the uneven surface area was also found even when only the Al film of the first layer was made thinner to about 30 nm, and the uneven, discolored area has expanded in size if annealing temperature was raised.

As noted before, if an oxidized Al area is created on the electrode surface, sufficient junction strength cannot be obtained between the electrode surface and Au wire or soldering material during the mount process. This can actually be a serious problem when mounting a device.

From the facts mentioned above, one may assume that if Al metal essential for acquiring ohmic property exists in the uppermost Au layer of an electrode, it is difficult to completely suppress the diffusion of Al caused by high-temperature annealing process, no matter how thin the diffusion barrier can be prepared within a reasonable film thickness allowed in the existing semiconductor manufacturing techniques.

To resolve the foregoing problems, it is, therefore, an object of the present invention to provide a nitride semiconductor light emitting device having an n electrode which demonstrates a satisfactory ohmic contact to an n-type nitride semiconductor and unlike in the related art techniques, which does not make the electrode surface rough even after a high-temperature annealing process, and a method of manufacturing the same.

To resolve the problems, it is essential to have the n-electrode which demonstrates a satisfactory ohmic contact to an n-type nitride semiconductor, without using Al metals.

The present invention therefore presents several embodiments of such a device and its manufacturing method in order to obtain satisfactory ohmic contacts to an n-type nitride semiconductor, and some of them are as follows.

1. A nitride semiconductor light emitting device, including: an n-type nitride semiconductor layer provided over a substrate; a light emitting layer provided over the n-type nitride semiconductor layer, for emitting light of a predetermined wavelength; a p-type nitride semiconductor layer provided over the light emitting layer; an n-electrode electrically connected to the n-type nitride semiconductor layer; and a p-electrode electrically connected to the p-type nitride semiconductor layer, wherein the n-electrode has a laminate structure composed of a first layer containing aluminum nitride and having a thickness not less than 1 nm or less than 5 nm, a second layer containing one or more metals selected from Ti, Zr, Hf, Mo, and Pt, and a third layer made of Au, from the near side of the n-type nitride semiconductor in order of mention, and wherein junction between the n-electrode and the n-type nitride semiconductor show ohmic properties.

2. A method of manufacturing a nitride semiconductor light emitting device, the method including the steps of: forming, over a substrate, an n-type nitride semiconductor layer containing at least an n-type impurity; forming, over the n-type nitride semiconductor layer, a light emitting layer for emitting light with a predetermined wavelength; forming, over the light emitting layer, a p-type nitride semiconductor layer containing a p-type impurity; forming, in contact with the p-type nitride semiconductor layer, a p-electrode; forming, in contact with the n-type nitride semiconductor, an n-electrode having a laminate structure composed of a first layer containing aluminum nitride and having a thickness not less than 1 nm or less than 5 nm, a second layer containing one or more metals selected from Ti, Zr, Hf, Mo, and Pt, and a third layer made of Au, from the bottom in order of mention; and carrying out an annealing process.

By using such an n-electrode, satisfactory ohmic contacts to an n-type nitride semiconductor were obtained, without using Al metals. At the same time, even when the n-electrode undergoes a high-temperature annealing process, diffusion of Al as in the related art techniques does not occur any more. Accordingly, the n-electrode and the Au-based solder/the Au wire are bonded in practically sufficient junction strength during the device mount process, and this in turn makes it possible to manufacture nitride semiconductor light emitting devices at a high yield.

BRIEF DESCRIPTION OF THE DRAWINGS

FIG. 3A shows I-V characteristics between electrodes of a sample prepared to verify functions and effects of the present invention;

FIG. 3B shows I-V characteristics between electrodes of a sample prepared to verify functions and effects of the present invention;

DETAILED DESCRIPTION OF THE PREFERRED EMBODIMENT

A preferred embodiment of the present invention will now be described with reference to the accompanying drawings.

Embodiment I

Figure 1:
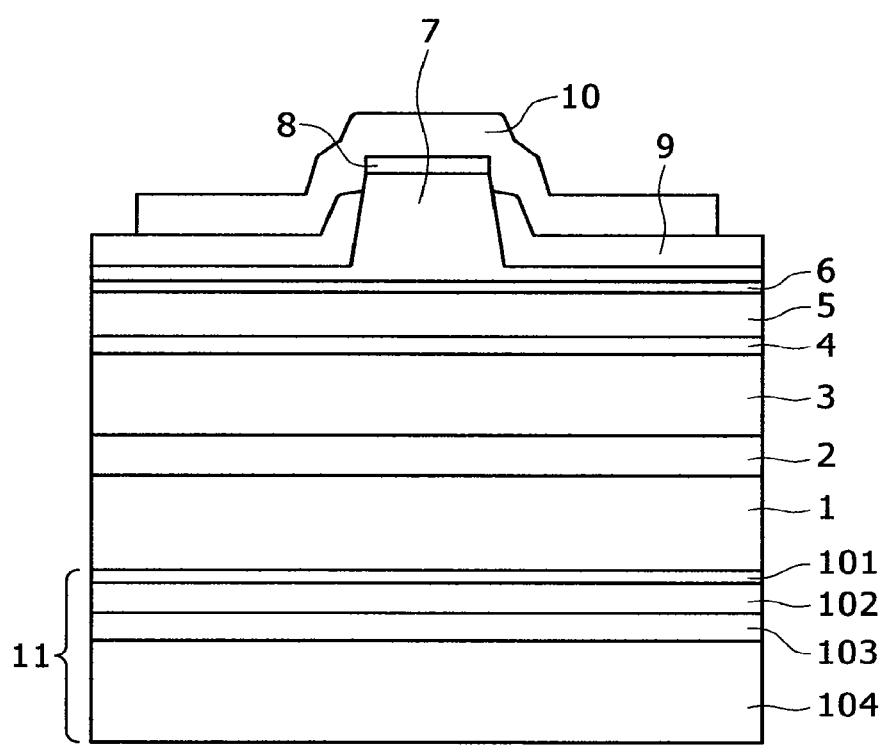
FIG. 1 shows a cross-sectional view of a nitride semiconductor laser device in accordance with a first embodiment of the present invention.
Figure 2:
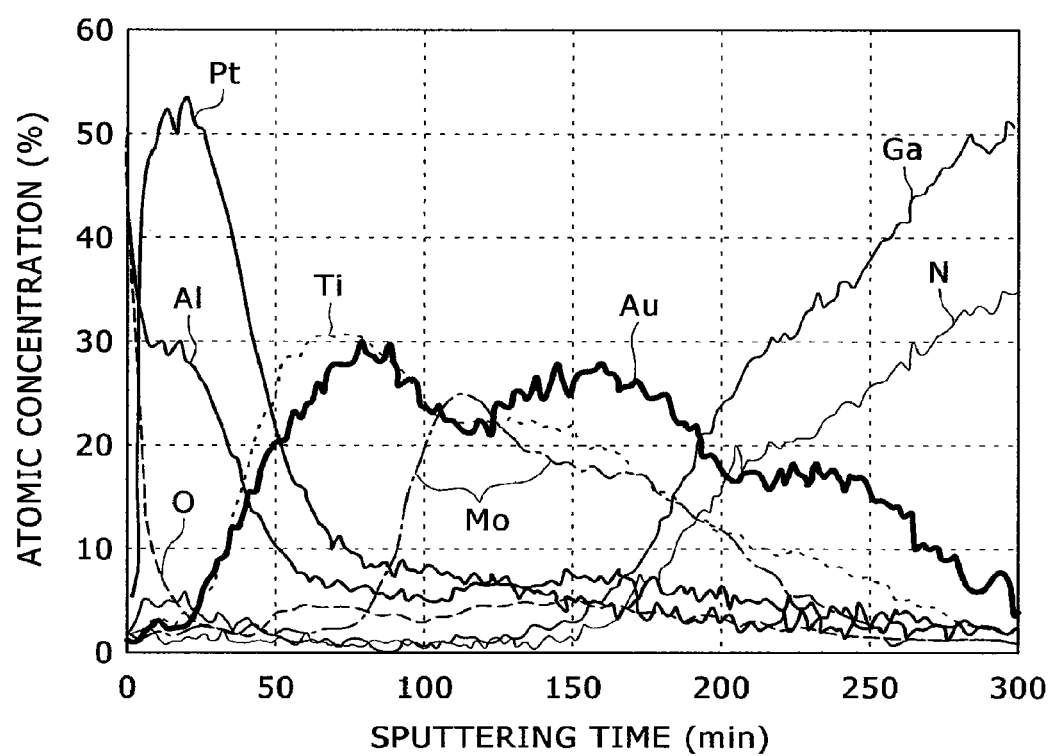
FIG. 2 graphically shows the result of analysis on an rugged or uneven surface of an electrode accompanied by discoloration after annealing at 500° C., the electrode having a laminate structure of Al (film thickness=100 nm)/Mo/Ti/Pt/Au provided based on a related art technique.

FIG. 1 is a schematic cross-sectional view of a nitride semiconductor laser in accordance with one embodiment of the present invention.

Since the main gist of the present invention lies in the structure of an n-electrode formed in contact with an n-type nitride semiconductor, any of conventional laminate structures was adopted for the structure of epitaxial growth layers of laser, to which the present invention is not limited.

The following will now explain an overall procedure of manufacturing a nitride semiconductor laser.

Referring to FIG. 1, on an n-type GaN substrate 1, an n-type buffer layer 2 made of Si-doped GaN, an n-type clad layer 3 made of Si-doped AlGaN, an n-type guide layer 4 made of Si-doped GaN, an active layer 5 made of InGaN in a multiple quantum well structure, an electronic block layer 6 made of Mg-doped AlGaN (composition ratio of Al is 7%), a p-type clad layer 7 made of Mg-doped AlGaN (composition ratio of Al is 4%), and a p-type contact layer 8 made of Mg-doped GaN were grown sequentially in the order of mention by molecular organic chemical vapor deposition (MOCVD).

Next, a desired area on an opened substrate surface by a resist pattern was etched by a well-known photolithography technique and a drying etching method using a chlorine based gas into the middle of the p-type clad layer 7, to be more specific, to a depth so as to leave 30 to 40 nm of the p-type clad layer 7. Accordingly, a 1.5 μm-wide ridge resonator having the p-type contact layer 8 as a core region is formed.

Next, a $SiO_2$ film 9 with thickness of 250 nm was formed over the front side of the substrate by a well-known insulation film formation method such as CVD or sputtering. Then, a photoresist pattern was formed by photolithography in a manner that only a region at the uppermost portion of the ridge was open. With this photoresist pattern as an etching mask, the open region was etched to expose the p-type contact layer 8 at the core portion of the ridge.

At this time, the etching process is carried out, either by wet etching in use of HF-based solution or by dry etching in use of fluorine-based gas (e.g., $CF_4$ or the like).

After the photoresist pattern was formed in a manner to open a desired region including the open, core portion of the ridge, a Ni (nickel) film, a Mo (molybdenum) film and Au were adhered sequentially onto the entire surface side of the substrate 1 by vacuum deposition for example, and unnecessary metal film(s) and the photoresist pattern were removed by a well-known lift-off method. In result, a p-electrode 10 made of Ni/Mo/Au is formed over the p-type contact layer 8 at the core portion of the ridge and over the $SiO_2$ film around it.

Next, the n-type GaN substrate 1 was polished and thinned, starting from the rear side of the substrate, by a well-known polishing technique until the substrate has a thickness of about 100 μm.

Next, on the entire rear side of the polished and thinned n-type GaN substrate 1, a 3 nm-thick aluminum nitride (AlN) 101 was first adhered by sputtering, and then a 50 nm-thick Ti (titanium) film 102, a 50 nm-thick Pt (platinum) film 103, and a 500 nm-thick Au (gold) film 104 were adhered sequentially in order of mention by electron beam evaporation for example. Later, the substrate was annealed at 500° C. for 10 minutes under nitrogen atmosphere. In this way, a four-layer n-electrode 11 making an ohmic contact to the n-type GaN substrate 1 is formed in a four-layer structure composed of AlN/Ti/Pt/Au from the bottom in order of mention.

Next, the n-electrode 11 was cleaved perpendicularly to the length direction of the ridge to form about 600 μm long bar-shaped resonator cross-sections on both sides, and a single-side coating film 12 having a desired reflectance and transmission factor is formed on both cross-sections.

Figure 5:
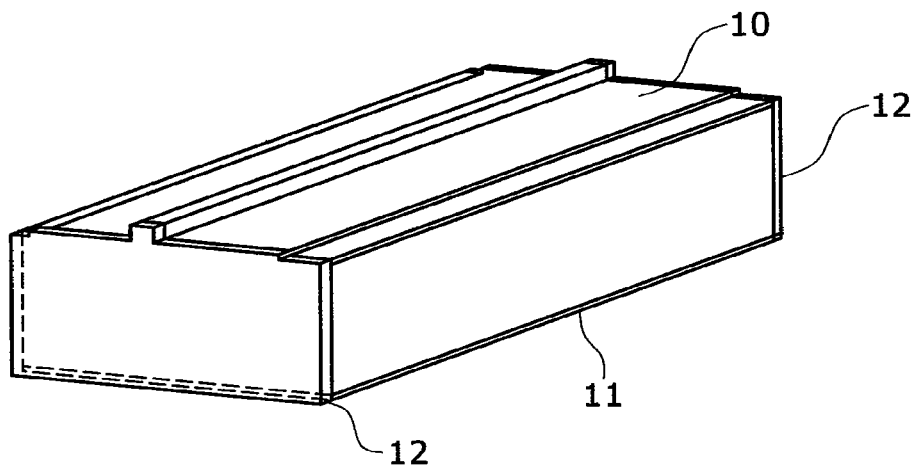
FIG. 5 is a schematic view of a nitride semiconductor laser device in accordance with the first embodiment of the present invention.

Further, the bars were made into a chip by cleavage to complete manufacturing of a nitride semiconductor laser that has the cross-sectional structure of FIG. 1 and the configuration shown in FIG. 5. With the p-electrode side of the laser chip as a mount face, the laser chip was mounted, by dye-bonding, on a sub-mount face that is made of SiC coated with a Au—Sn solder, and the sub-mount having the laser chip mounted thereon is mounted further on a stem. Lastly, the p-electrode side of the laser chip facing upward and the electrode side on the sub-mount to which the n-electrode is electrically connected are properly bonded and wired by Au wires, thereby completing the manufacture of a nitride semiconductor laser device.

Among fifty of nitride semiconductor laser devices that were prepared following the manufacturing process described above, no connection defect occurred in the process of wire bonding, and the outer appearance of the junction was also satisfactory.

In order to evaluate adhesion between the Au wire and the n-electrode surface of each, the inventors conducted a pull test on the Au wire bonded to the n-electrode surface. It turned out that breaking strength for all the 50 laser devices was 5 g or more, and all the broken portions, if any, were found along the Au wires.

Further, I-V (current-voltage) characteristics of each were evaluated through an external input terminal to which Au wire of each laser device is connected. There was no sharp increase in direct resistance or non-uniformity in increasing voltage, and electrical conduction between the electrode and the Au wire was also satisfactory.

The following will explain the structure, function and effect of an n-type ohmic electrode in accordance with preferred embodiments of the present invention, on the basis of the experimental results provided by the inventors.

For the experiment, a low-temperature buffer layer consisting of GaN, an undoped GaN layer with film thickness of 5000 nm, and a Si-doped GaN (doping concentration=1.0-2.0×$10^{18}$ cm$^{-3}$, film thickness=1000 nm) were epitaxially grown by molecular organic chemical vapor deposition (MOCVD).

As for the evaluation on the ohmic property in used of the manufacturing of the nitride semiconductor laser, a conventional transmission line model (TLM) pattern was formed by a photoresist to complete a sample prior to the electrode formation.

Mesa width (=electrode width) of the TLM pattern composed of the Si-doped GaN layer is 100 μm, and photoresist openings for adhering an n-electrode are arranged at the surface of the earth formed by mesa-etching in such a manner that interelectrode gaps are 20 μm, 40 μm, 80 μm, 160 μm, and 320 μm.

Aluminum nitride to become the undermost layer of an electrode was formed by sputtering at three different film thicknesses, e.g., 3 nm, 5 nm, and 8 nm, so as to prepare three kinds of samples. At this time, the substrate was not heated.

Next, on each of four samples, i.e., three samples described above and one sample (sample #1) without having aluminum nitride adhered thereto, a Ti (titanium) layer with film thickness of 50 nm, a Pt (platinum) layer with film thickness of 50 nm, and a Au (gold) layer with film thickness of 300 nm were deposited by electron beam evaporation. Later, the photoresist, unnecessary metal films and the aluminum nitride film were removed by a well-known lift-off method, such that the samples were prepared to get ready for TLM measurement.

The four samples were then annealed at a temperature range of 400° C. to 550° C. under nitrogen atmosphere, and I-V characteristics between electrodes with the interelectrode gap of 20 μm were evaluated (refer to FIGS. 3A through 3D).

Figure 3C:
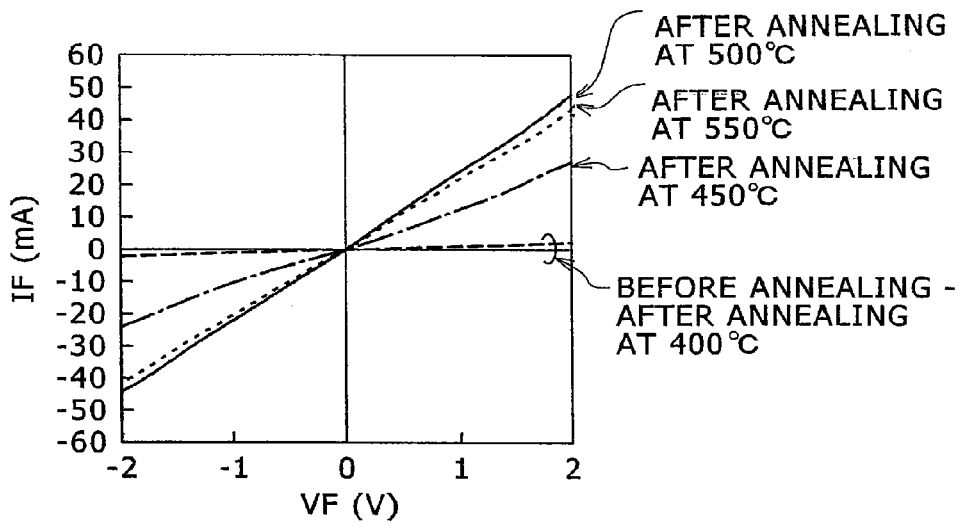
FIG. 3C shows I-V characteristics between electrodes of a sample prepared to verify functions and effects of the present invention.
Figure 3D:
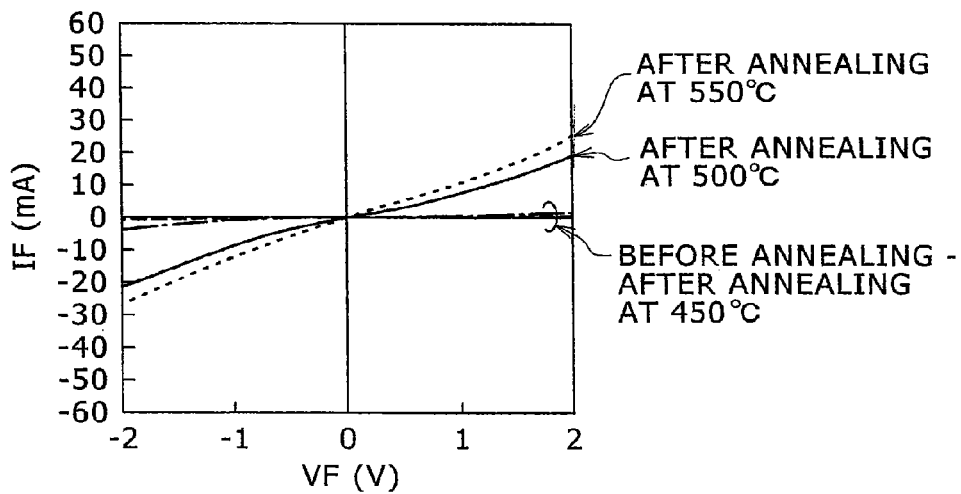
FIG. 3D shows I-V characteristics between electrodes of a sample prepared to verify functions and effects of the present invention.

More specifically, FIG. 3A shows characteristics of only the Ti/Pt/Au electrode without having aluminum nitride, and FIGS. 3B, 3C, and 3D show characteristics of an electrode that is formed by laying Ti/Pt/Au over aluminum nitride (hereinafter abbreviated as AlN in the case of describing a laminate structure) of the undermost layer in different film thicknesses of 3 nm, 5 nm, and 8 nm, respectively.

The following will now explain characteristics of each electrode.

In the case of the Ti/Pt/Au electrode of FIG. 3A, it showed non-ohmic properties before annealing, but a small increase in current was observed as voltage increased. After the electrode was annealed at 400° C. or higher, however, nearly no current flew.

In the case of the AlN (3 nm)/Ti/Pt/Au electrode of FIG. 3B, there was no increase in current before annealing, but comparatively good ohmic properties were shown after annealing at 400° C. or higher. It demonstrated the best I-V characteristics after it was annealed at 450 to 500° C. Though not shown, $\rho_c$ after annealing at 600° C. was less than $1.0 \times 10^{-4}$ $\Omega cm^2$, and the lustrous electrode surface was tarnished due to slight unevenness. However, a noticeably discolored area as in the related art was not observed, and the electrode surface well retained Au (gold) color.

In the case of the AlN (5 nm)/Ti/Pt/Au electrode of FIG. 3C, there was no increase in current prior to annealing until after annealing at 400° C., and ohmic properties started showing after the electrode was annealed at 450° C. or higher. The best I-V characteristics were demonstrated after the electrode was annealed at 500 to 550° C., but its current value was small compared with that of (b).

In the case of the AlN (8 nm)/Ti/Pt/Au electrode of FIG. 3D, there was no increase in current prior to annealing until after annealing at 450° C., and ohmic properties started showing only after the electrode was annealed at 500° C. Even after annealing at 550° C., any large current value was not obtained, compared with that of (b) or (c).

Figure 4:
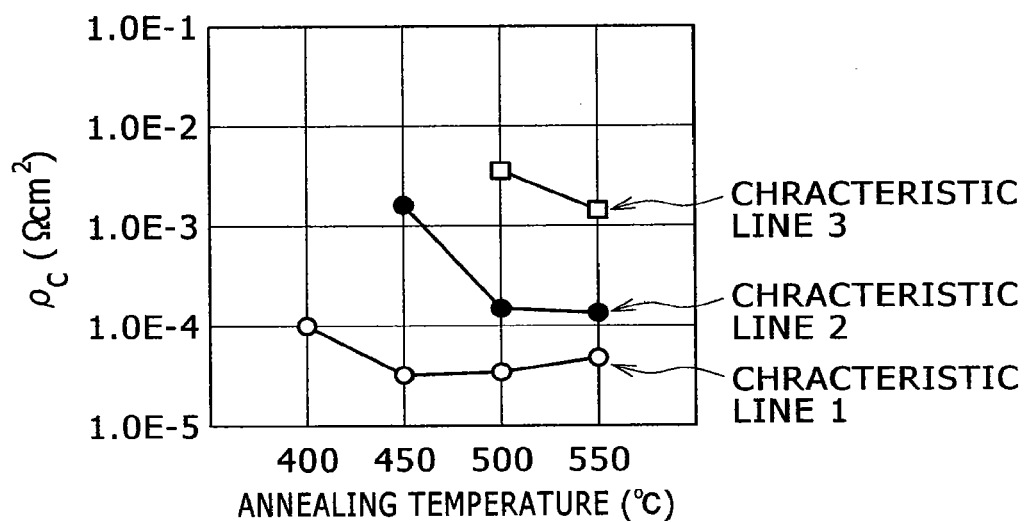
FIG. 4 graphically shows the result of evaluation on the dependence of non-contact resistivity ($\rho_c$) of a sample prepared to verify functions and effects of the present invention upon annealing temperature.

FIG. 4 shows evaluation results on the dependency of non-contact resistivity ($\rho_c$) calculated in use of resistance value obtained from the I-V characteristics upon annealing temperature.

As can be seen from characteristic line #1 (AlN film thickness=3 nm), characteristic line #2 (AlN film thickness=5 nm), and characteristic line #3 (AlN film thickness=8 nm) in the drawing, $\rho_c$ seems to increase along with an increase in the film thickness of aluminum nitride, and the aluminum nitride film should be at least 5 nm thick to show the I-V characteristics described above and to obtain ohmic properties applicable to a light emitting device such as a laser device.

On the contrary, one might presume that satisfactory ohmic properties cannot be obtained as the aluminum nitride film gets thinner. According to the experimental results, ohmic properties do not show at all if the aluminum nitride film is not provided.

Therefore, the inventors believed that a lower limit of the thickness of an aluminum nitride film to be adhered would be around 1 nm which is the same as the limit set based on the conventional evaluation on the film thickness. In other words, ohmic properties are expected to improve even with the presence of thin aluminum nitride islands, not necessarily in film form.

Next, the inventors examined a change in the laminate structure of the AlN (film thickness=3 nm)/Ti/Pt/Au electrode having demonstrated the best characteristics in the previous experiment before annealing and after annealing at 500° C., by cross-section TEM observation and EDX surface analysis. It turned out that there was no significant change in aluminum nitride of the first layer even after annealing at 500° C., and its presence was observed very clearly. Moreover, except for an occurrence of slight interdiffusion across the Ti/Pt/Au interface of the upper layer, the electrode well maintained its original laminate state.

The observation facts noted above indicate that in order to obtain ohmic contacts to an n-type nitride semiconductor without using Al metals, it is important to provide aluminum nitride with a designated film thickness between the n-type nitride semiconductor and a metal film made of a metal other than Al. Also, by overlaying and adhering metal films during sputtering used as part of the aluminum nitride formation method and by carrying out an annealing process at a temperature at least between 400 and 600° C. in conformation to the experiment results, it becomes possible to obtain a satisfactory ohmic contact to an n-type nitride semiconductor and to maintain the uppermost Au surface in a suitable condition for the mount process, without hetero-metal diffusion therein by annealing.

Having learned from the experiment results that I-V characteristics change dramatically about a certain annealing temperature and that no significant change was observed in the aluminum nitride film after annealing at 500° C., the inventors believed a hetero interface could have been formed as the n-type nitride semiconductor bonds epitaxially, during annealing, with the less-crystalline aluminum nitride film that has simply been deposited on the n-type nitride semiconductor, such that ohmic contacts were realized by tunnel effects between the n-type nitride semiconductor and the metal film on aluminum nitride. The same can also be predicted from the observation result that the resistance value between n-electrodes has a tendency to increase as the aluminum nitride film having a band gap greater than that of GaN gets thicker.

On the other hand, in order to grow aluminum nitride on a substrate by a conventional epitaxial growth method such as MOVPE, the substrate needs to be heated at 1200° C. or higher. If a metal film is formed on that substrate surface, or if the substrate has been thinned, it is highly possible that the growth path is contaminated by metal(s) or the substrate is cracked or split. Because of these or other adverse effects, the method is not likely to be selected in reality.

As a further example, if a substrate having an active layer containing In (indium) is annealed at 1200° C. or higher, the active layer could be broken due to an occurrence of diffusion and segregation of In.

The present invention is characterized in that the same function and effect are obtained from aluminum nitride that is formed by a film formation method such as sputter in general as part of the semiconductor processing process, and that aluminum nitride can be formed by other methods like CVD or sublimation besides the sputtering method.

In addition, as for the electrode metal(s) formed on aluminum nitride, one can conclude, based on the inferential principle of obtaining ohmic properties, any kind of metal materials or metal compound materials may be used as long as they are adhesive to aluminum nitride.

Embodiment 2

Figure 6:
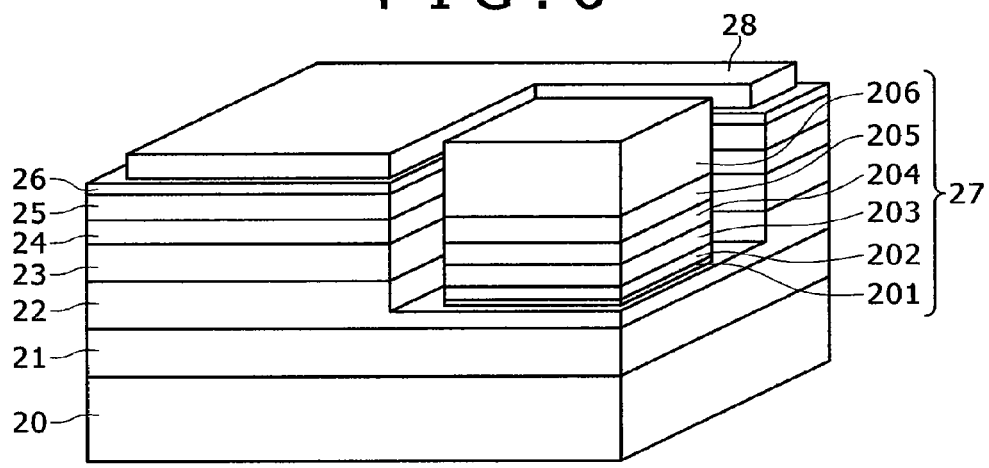
FIG. 6 is a schematic cross-sectional view of a nitride semiconductor light emitting diode in accordance with a second embodiment of the present invention.
Figure 7:
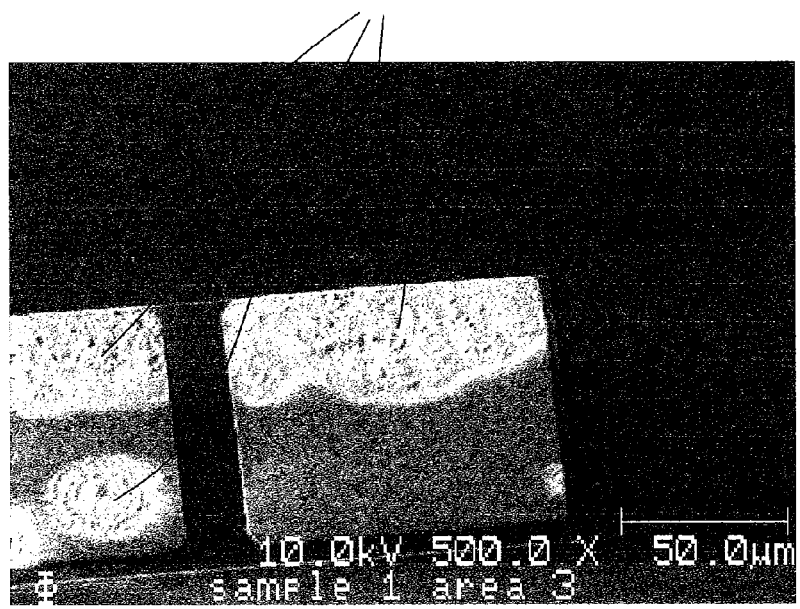
FIG. 7 graphically shows the observation result of the surface of an electrode after annealing at 500° C., the electrode having a laminate structure of Al (film thickness=100 nm)/Mo/Ti/Pt/Au provided based on a related art technique.

FIG. 6 is a schematic view of a nitride semiconductor light emitting diode in accordance with another embodiment of the present invention. An overall manufacturing method thereof will now be explained below.

On a sapphire substrate 20 is formed a multiple layer structure including a buffer layer 21 made of undoped GaN, a Si-doped n-type GaN layer 22 having carrier concentration of $2 \times 10^{18}$ $cm^{-3}$ and film thickness of 5 μm, Si-doped n-type AlGaN clad layer 23, an active layer 24 made of $In_bGa_{1-b}N$ (0<b≤0.1), a p-type clad layer 25 made of Mg-doped AlGaN having Mg doping concentration of $3.0 \times 10^{19}$ $cm^{-3}$ and film thickness of 40 nm, and a p-type contact layer 26 made of Mg-doped GaN, the layers being sequentially grown by molecular organic chemical vapor deposition (MOCVD). Next, a desired region was etched, starting from the surface side of the substrate 20, by a well-known photolithography technique and by dry etching using a chlorine based gas, so as to expose the Si-doped n-type GaN layer 22.

Next, a 1.5 nm-thick aluminum nitride (AlN) 201 was adhered by sputtering to a desired position of the exposed Si-doped n-type GaN layer 22. After that, a 30 nm-thick Hf (hafnium) film 202, a 50 nm-thick Mo (molybdenum) film 203, a 100 nm-thick Zr (zirconium) film 204, a 100 nm-thick Pt (platinum) film 205, and a 500 nm-thick Au (gold) film 206 were further deposited on the AlN film 201 by electron beam evaporation, and then annealed at under nitrogen atmosphere. In this manner, an n-electrode 27, having the six-layer laminate structure of AlN/Hf/Mo/Zr/Pt/Au and making an ohmic contact to the Si-doped n-type GaN layer 22, is thus formed.

Next, a p-type ohmic electrode 28 is formed by forming a laminate composed of 30 nm-thick Pd film/70-nm-thick Pt film/300-nm Au film at a desired position on a second p-type clad layer 26 in a non-etched region.

At this time, the uppermost surface of the n-electrode 27 and the uppermost surface of the p-electrode 28 are roughly the same height.

After that, the rear side of the sapphire substrate 20 was made thinner by diamond polishing particles until it becomes as thin as 200 μm, and, as a final process, the polished face was subjected to mirror-like finishing and was made into a chip of desired size, thereby completing the manufacture of a nitride semiconductor LED.

Since the LED uses light that is emitted from the mirror-like polished rear side through the sapphire substrate, patterning, by the Au—Sn solder, should be performed in advance on the mount where the LED is to be mounted, and for the patterned Au—Sn solder, the mount process was carried out in a manner that the Au—Sn solder pattern was matched with each of the p- and n-electrodes.

A total of 30 LED devices were manufactured following the above process, and I-V characteristics of each LED were evaluated through an external input terminal. It turned out that an average voltage necessary to obtain 50 mA current was 3.25V. Also, there was no sharp increase in voltage and current was obtained for each.

By conducting the shear failure test on each of the mounted LED chips, the inventors learned that all of them had shear strength of 400 g or more, and observed no occurrence of a problem during the mount process.

Although the embodiments having been explained so far utilized a sapphire substrate as a substrate material, it is needless to say that any substrate material, say, GaN, SIC, Si, or the like can also be used as long as a nitride semiconductor can grow reasonably thereon. Further, a variety of substrate materials may be used, depending on the structure of LED to be manufactured.

While the embodiments having been explained so far utilized the Ti/Pt laminate and the Hf/Mo/Zr/Pt laminate, from the bottom, as metal films with aluminum nitride on the n-electrode and with Au, the present invention is not limited thereto but any suitable metal laminate of different film thickness depending on the material used for bonding, e.g., Au wire or Au—Sn solder, can also be used.

The embodiments of the present invention have been mainly focused on the manufacturing method of a nitride semiconductor light emitting device, but the structure of a specific nitride semiconductor is not limited to those embodiments but can be varied based on the configuration or required function for a device to be manufactured.

By applying the n-electrode of the invention to a nitride semiconductor light emitting device, satisfactory ohmic contacts to an n-type nitride semiconductor can be obtained, and the uppermost surface of the electrode even after high-temperature annealing still retains Au suitable for the mount process.

What is claimed is:

1. A nitride semiconductor light emitting device, comprising:
    a substrate selected from one of sapphire, GaN, SiC, and Si;
    an expitaxially-grown n-type GaN semiconductor layer formed over the substrate;
    a plurality of expitaxially-grown nitride semiconductor layers, formed over the n-type GaN semiconductor layer, comprising an n-type nitride semiconductor layer, a light emitting layer, and a p-type nitride semiconductor layer;
    a p-type electrode formed after said epitaxial growth and electrically connected to the p-type nitride semiconductor layer; and
    an n-type electrode formed on an exposed surface of the n-type GaN semiconductor layer after said epitaxial growth,
    wherein the exposed surface of the n-type GaN semiconductor layer comprises etched portions of the plurality of nitride semiconductor layers,
    wherein the n-type electrode comprises a first layer, a second layer, and a third layer, disposed on the exposed surface of the n-type GaN semiconductor layer, and provided in order as listed,
    wherein the first layer contains aluminum nitride provided in contact with the exposed surface of the n-type GaN semiconductor layer and has a thickness of at least 1 nm and less than 5 nm,
    wherein the second layer contains one or more metals selected from Ti, Zr, Hf, Mo, and Pt, and
    wherein the third layer is made of Au.

2. The nitride semiconductor light emitting device according to claim 1,
    wherein an electrical property making a junction between the n-type electrode and the n-type GaN semiconductor layer is an ohmic property.

3. The nitride semiconductor light emitting device according to claim 1,
    wherein the second layer of the n-type electrode comprises a two-layer structure having Ti disposed adjacent to the first layer and Pt disposed adjacent to the third layer.

4. The nitride semiconductor light emitting device according to claim 1,
    wherein the aluminum nitride is provided in a form of islands, so as to expose at least part of the exposed surface of the n-type GaN semiconductor layer.

5. The nitride semiconductor light emitting device according to claim 1,
    wherein the nitride semiconductor light emitting device is a light emitting diode (LED).

6. A nitride semiconductor light emitting device, comprising:
    an n-type GaN substrate comprising a first surface and a second surface;
    a plurality of expitaxially-grown nitride semiconductor layers, formed over the first surface of the n-type GaN substrate, comprising an n-type nitride semiconductor layer, a light emitting layer, and a p-type nitride semiconductor layer;
    a p-type electrode formed after said epitaxial growth and electrically connected to the p-type nitride semiconductor layer; and
    an n-type electrode formed on the second surface of the n-type GaN substrate,
    wherein the n-type electrode comprises a first layer, a second layer, and a third layer, disposed at a second surface side of the n-type GaN substrate, and provided in order as listed, wherein the first layer contains aluminum nitride provided in contact with the second surface of the n-type GaN substrate and has a thickness of at least 1 nm and less than 5 nm, wherein the second layer contains one or more metals selected from Ti, Zr, Hf, Mo, and Pt, and wherein the third layer is made of Au.

7. The nitride semiconductor light emitting device according to claim 6, wherein an electrical property making a junction between the n-type electrode and the n-type GaN substrate is an ohmic property.

8. The nitride semiconductor light emitting device according to claim 6, wherein the second layer of the n-type electrode comprises a two-layer structure having Ti disposed adjacent to the first layer and Pt disposed adjacent to the third layer.

9. The nitride semiconductor light emitting device according to claim 6, wherein the aluminum nitride is provided in a form of islands, so as to expose at least part of the n-type GaN substrate.

10. The nitride semiconductor light emitting device according to claim 6, wherein the nitride semiconductor light emitting device is a laser diode (LD).

* * * * *